United States Patent [19]

Dueber et al.

[11] Patent Number: 4,565,769

[45] Date of Patent: Jan. 21, 1986

[54] POLYMERIC SENSITIZERS FOR PHOTOPOLYMER COMPOSITION

[75] Inventors: Thomas E. Dueber; Bruce M. Monroe, both of Wilmington, Del.

[73] Assignee: E. I. Du Pont de Nemours and Company, Wilmington, Del.

[21] Appl. No.: 673,924

[22] Filed: Nov. 21, 1984

[51] Int. Cl.$^4$ .................................................. G03C 1/69
[52] U.S. Cl. ................................. 430/281; 430/919; 430/923
[58] Field of Search ........................ 430/281, 919, 923

[56] References Cited

U.S. PATENT DOCUMENTS

| | | | |
|---|---|---|---|
| 3,652,275 | 3/1972 | Baun et al. | 430/281 |
| 3,697,280 | 10/1972 | Strilko | 430/281 |
| 3,881,935 | 5/1975 | Apellaniz | 430/923 |
| 3,929,490 | 12/1975 | Reiter et al. | 430/923 |
| 4,046,577 | 9/1977 | Muzyczko et al. | 96/115 R |
| 4,077,806 | 3/1978 | Muzyczko et al. | 96/115 R |
| 4,089,815 | 5/1978 | Reiter et al. | 260/2 R |
| 4,147,604 | 4/1979 | Kuesters et al. | 430/281 |
| 4,161,162 | 7/1979 | Dueber | 430/281 |
| 4,289,843 | 9/1981 | Boutle et al. | 430/281 |
| 4,437,836 | 3/1984 | Schmitz-Josten | 430/281 |

*Primary Examiner*—Jack P. Brammer

[57] ABSTRACT

Photopolymerizable composition consisting essentially of (A) at least one ethylenically unsaturated monomeric compound, (B) at least one 2,4,5-triarylimidazolyl dimer, (C) sensitizing amount of at least one polymeric sensitizer, weight average molecular weight 10,000 to 300,000, which is the reaction product of (1) a reactive photosensitizer and (2) a reactive polymer as defined herein, and (D) optionally an organic polymeric binder. The compositions are useful in photoresists, chemical milling, toning films and printing plates.

11 Claims, 3 Drawing Figures

POLYMERIC SENSITIZERS FOR PHOTOPOLYMER COMPOSITION

DESCRIPTION

TECHNICAL FIELD

This invention relates to a new photopolymerizable composition. More particularly this invention relates to photopolymerizable compositions having present polymeric sensitizers.

BACKGROUND ART

Photopolymerizable compositions are being used for an increasing number of usages. For example this type of composition is now commercially used in resist formation, copying, printing, etc. Such compositions generally contain an ethylenically unsaturated compound or other type polymerizable compound, a photoinitiator or photoinitiator system and preferably a solvent-soluble or aqueous or alkaline soluble organic polymeric binder compound. Many of the known useful photopolymerizable compositions are limited in application because the initiators are not as active as desired and/or the initiators are activatable primarily in the ultraviolet region of the spectrum. Hexaarylbiimidazole compounds are good initiators of photopolymerization. To improve photospeed or to improve sensitivity in the visibile region of the spectrum, sensitizing amounts of arylidene aryl ketone compound of Dueber U.S. Pat. No. 4,162,162, N-alkylindolylidene or N-alkylbenzothiazolylidene alkanones of Dueber and Link U.S. Pat. No. 4,454,218, and constrained N-alkylamino aryl ketones of Anderson and Dueber U.S. application Ser. No. 645,115, filed Aug. 28, 1984 now U.S. Pat. No. 4,525,062, have been added to photopolymerizable compositions containing hexaarylbiimidazole compounds.

While the aforementioned compositions have either improved photospeed or provided improved sensitivity in the visible region of the spectrum, the known sensitizers are nonpolymeric compounds. It is desired to provide polymeric sensitizers which may improve adhesion in aqueous resists, restrict migration in multilayer films, or become incorporated into the photopolymer produced upon exposure.

BRIEF DESCRIPTION OF DRAWING

In the accompanying drawing forming a material part of this disclosure

FIG. 1A illustrates exposure to visible light through a photomask and FIG. 1B illustrates ultraviolet radiation exposure through a different photomask.

FIG. 1C illustrates the laminate after development.

DISCLOSURE OF THE INVENTION

Figure 1A:
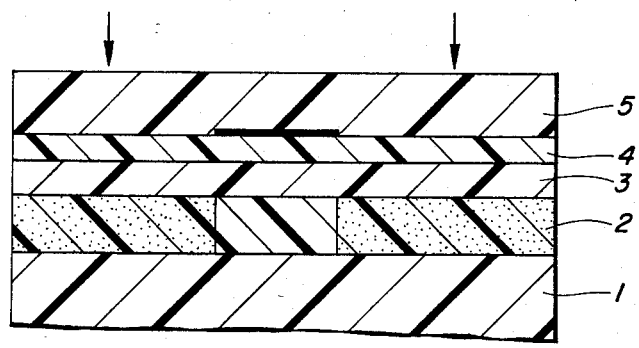
FIGS. 1A, 1B and 1C are cross sections of a two layer photoresist laminated to a support.

In accordance with this invention there is provided a photopolymerizable composition consisting essentially of (A) at least one nongaseous ethylenically unsaturated compound having at least one terminal ethylenically unsaturated group, a boiling point above 100° C. at normal atmospheric pressure and being capable of addition polymerization;

(B) at least one 2,4,5-triarylimidazolyl dimer consisting of two lophine radicals bound together by a single covalent bond;

(C) a sensitizing amount of at least one polymeric sensitizer sensitive to ultraviolet or visible radiation and having a weight average molecular weight in the range of 10,000 to 300,000, the polymeric sensitizer being the reaction product of (1) a reactive sensitizer moiety of the formula:

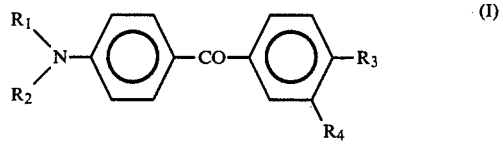

(I)

wherein $R_1$ is alkyl of 1 to 12 carbon atoms:

$R_2$ is alkyl of 1 to 12 carbon atoms, $-CH_2CH_2Cl$;

$R_3$ is H, and with the proviso that when $R_2$ is not $-CH_2CH_2Cl$, $R_3$ can be one of $-O(CH_2CH_2O)_n-CH_2CH_2OH$, $-O(CH_2CH_2CH_2O)_n-CH_2CH_2CH_2OH$ wherein n is 0 to 10, $-OCH_2CH_2NH_2$, $-(CH_2)_nOH$, $-(CH_2)_nNH_2$ wherein n is 1 to 12; and $R_4$ is H, and with the proviso that when $R_2$ is not $-CH_2CH_2Cl$ and $R_3$ is H, $R_4$ is one of $-O(CH_2CH_2O)_n-CH_2CH_2OH$, $-O(CH_2CH_2CH_2O)_n-CH_2CH_2CH_2OH$ wherein n is 0 to 10, $-OCH_2CH_2NH_2$, $-(CH_2)_nOH$, $-(CH_2)_nNH_2$ wherein n is 1 to 12; or

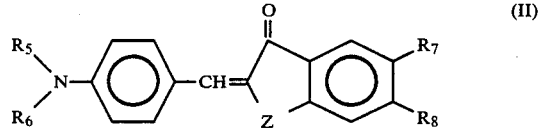

(II)

wherein Z is H, H; $-CH_2-$, $-CH_2CH_2-$, $CH_2O$ with oxygen bonded to the aromatic ring;

$R_5$ is alkyl of 1 to 12 carbon atoms;

$R_6$ is alkyl of 1 to 12 carbon atoms, $-CH_2CH_2Cl$;

$R_7$ is H, $-OCH_3$, and with the proviso that when $R_6$ is not $-CH_2CH_2Cl$, $R_7$ can be one of $-O(CH_2CH_2O)_n-CH_2CH_2OH$, $-O(CH_2CH_2CH_2O)_n-CH_2CH_2CH_2OH$ wherein n is 0 to 10, $-OCH_2CH_2NH_2$, $-(CH_2)_nOH$, $-(CH_2)_nNH_2$ wherein n is 1 to 12; and $R_8$ is H, $-OCH_3$, and with the proviso than when $R_6$ is not $-CH_2CH_2Cl$ and $R_7$ is H or $-OCH_3$, $R_8$ is one of $-O(CH_2CH_2O)_n-CH_2CH_2OH$, $-O(CH_2CH_2CH_2O)_n-CH_2CH_2CH_2OH$ wherein n is 0 to 10, $-OCH_2CH_2NH_2$, $-(CH_2)_nOH$, $-(CH_2)_nNH_2$ wherein n is 1 to 12; and (2) a reactive polymer taken from the group consisting of methyl methacrylate, methyl acrylate, isocyanatoethyl methacrylate, maleic anhydride, chloromethyl styrene, p-hydroxystyrene, acrylic acid, methacrylic acid, phenolformaldehyde resins, epoxy polymers, and mixtures of said polymers, the polymeric sensitizer having 0.1 to 70% by weight of the sensitizer moiety; and (D) optionally at least one organic polymeric binder.

The photopolymerizable compositions consist essentially of at least one ethylenically unsaturated compound, at least one 2,4,5-triarylimidazolyl dimer as photoinitiator, at least one polymeric ultraviolet or visible radiation sensitizer defined above and described more fully below, and optionally but preferably at least one organic polymeric binder. "Consists essentially of" as used to define the photopolymerizable composition means that unspecified materials or components are not excluded so long as they do not prevent the benefits of the invention from being realized. Other useful additives in the photopolymerizable composition include: inhibitors, including photoinhibitors, leuco dyes, accelerators such as chain transfer agents, oxygen scavengers, and inert components, e.g., plasticizers, dyes and pigments to increase visibility of the image, fillers, etc.

The ethylenically unsaturated compound (monomer) can be present in the photopolymerizable composition in an amount of 3 to 100 parts by weight, and the organic polymeric binder can be present in an amount of 0 to 97 parts by weight based on the total weight of the monomer and binder. The 2,4,5-triarylimidazolyl dimer photoinitiator can be present in an amount of 0.001 to 20 parts by weight of the combined weight of ethylenically unsaturated compound and binder. The polymeric sensitizer can be present in the photopolymerizable composition in an amount of 0.1 to 80 percent by weight, preferably 5 to 20 percent by weight based on the total dry weight of the composition. The other additives can be present in minor amounts known to those skilled in the art.

The ethylenically unsaturated compounds (A) (photopolymerizable monomers of this invention) have a boiling point above 100° C. at normal atmospheric pressure and are capable of forming a high molecular weight polymer by photoinitiated, addition polymerization. Suitable compounds are disclosed in Chang U.S. Pat. No. 3,756,827, column 2, line 36 to column 3, line 30, the disclosure of which is incorporated herein by reference. Other useful monomers include ethylenically unsaturated diester polyhydroxy polyethers as described in Chambers U.S. Pat. No. 4,245,031. Examples include the Epocryl® resins sold by Shell Chemical Co. Many of the polymerizable monomers are subject to thermal polymerization, especially when stored for long periods or at elevated temperatures. When such compounds are supplied commercially, it is customary for them to contain a small, but effective, amount of a thermal polymerization inhibitor. These inhibitors may be left in the monomers when the photopolymerizable coating compositions of this invention are prepared. The resulting compositions usually have satisfactory thermal stability. If unusual thermal exposure is anticipated, or if monomers containing little or no thermal polymerization inhibitor are employed, compositions with adequate shelf life can be obtained by incorporating, e.g., up to 0.5 percent, by weight of monomer, of a thermal polymerization inhibitor such as hydroquinone, methylhydroquinone, p-methoxyphenol, etc. Preferred ethylenically unsaturated compounds are triethylene glycol diacrylate and trimethylolpropane triacrylate.

Preferably at least one 2,4,5-triarylimidazolyl dimer consisting of two lophine radicals bound together by a single covalent bond (photoinitiator) (B) is present in the photopolymerizable compositions. The biimidazoles are photodissociable to the corresponding triarylimidazolyl radicals. These hexaarylbiimidazoles absorb maximally in the 255-275 nm region, and usually show some, though lesser absorption in the 300-375 nm region. Although the absorption bands tend to tail out to include wavelengths as high as about 430 nm, they normally require light rich in the 255-375 nm wavelengths for their dissociation.

The hexaarylbiimidazoles can be represented by the formula:

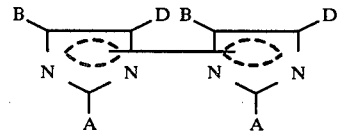

wherein A, B and D represent aryl groups which can be the same or different, carbocyclic or heterocyclic, unsubstituted or substituted with substituents that do not interfere with the dissociation of the hexaarylbiimidazole to the triarylimidazolyl radical or with the oxidation of a leuco dye that may be present and each dotted circle stands for four delocalized electrons (i.e., two conjugated double bonds) which satisfy the valences of the carbon and nitrogen atoms of the imidazolyl ring. The B and D aryl groups can each be substituted with 0-3 substituents and the A aryl groups can be substituted with 0-4 substituents. Useful 2,4,5-triarylimidazolyl dimers are disclosed in Baum and Henry U.S. Pat. No. 3,652,275, column 5, line 44 to column 7, line 16, the disclosure of which is incorporated herein by reference.

The polymeric sensitizers sensitive to ultraviolet or visible radiation (C) useful in the photopolymerizable compositions have been defined broadly above. The polymeric sensitizers are reaction products of a photosensitizer as defined above having a group which is reactive with the reactive polymer or a reactive monomer which is subsequently polymerized to yield a photosensitive polymer. In general, the sensitizer moiety can be covalently bonded to the photosensitive polymer through reactive groups present on one of the alkyl groups attached to the nitrogen atom of the sensitizer moiety or on a substituent present on the aromatic ring which is either ortho or para to the carbonyl group of the sensitizer moiety. The length of the interconnecting alkyl chains can be up to 12 carbon atoms each. The chains are preferably unbranched close to the aromatic ring of the N-atom of the sensitizer so that the planarity of the sensitizer moiety is not altered.

The weight average molecular weight range of the polymeric sensitizer can range from 10,000 to 300,000. The molecular weight can be varied depending on its use. For example, where restricted migration of the polymeric sensitizer is required, the higher molecular weight polymers are preferable.

By way of illustration but not limitation of the invention, useful photosensitive polymers that can be prepared by reaction of a reactive sensitizer moiety with a reactive polymer include:

1. Copolymers of methyl methacrylate and/or methyl acrylate with isocyanatoethyl methacrylate.
2. Anhydride containing polymers such as a polymer containing maleic anhydride.
3. Transesterification with poly(methyl acrylate) or esterification of carboxylic acid-containing polymers.

The sensitizer moiety reactive with polymers 1 to 3 above may contain a primary alcohol group, e.g., —OCH$_2$CH$_2$OH where the sensitizer moiety is attached to the oxygen atom.

4. Reaction of reactive benzyl chloride functional groups with photosensitive phenols, e.g., the reaction product of a copolymer of methyl methacrylate and chloromethylstyrene with 4'-hydroxy-4-dimethylaminobenzophenone and sodium hydroxide in dimethylformamide.

5. Reaction of a para-hydroxystyrene polymer with a primary organochloride, e.g.,

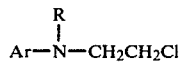

where R is alkyl of 1 to 12 carbon atoms and the

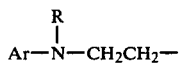

group is a sensitizer moiety.

6. Reaction of a polymer containing a carboxylic acid such as acrylic acid, a polymer containing an anhydride such as maleic anhydride, or a polymer containing epoxy groups such as the reaction products of epichlorohydrin and Bisphenol A with a reactive amino group on the sensitizer moiety.

A preferred polymeric sensitizer active in the ultraviolet region of the spectrum is the reaction product of a copolymer of methyl methacrylate and isocyanatoethyl methacrylate and 1-[4-(dimethylamino)phenyl]-1-[4-(2-hydroxyethoxy)phenyl]-methanone. Preferred polymeric sensitizers active in the visible region of the spectrum include: a copolymer of methyl methacrylate, methyl acrylate and a reaction product of isocyanatoethyl methacrylate and 3-[4-dimethylamino)phenyl]-1-[4-(2-hydroxyethoxy)phenyl]-2-propene-1-one, and a copolymer of methyl methacrylate and a reaction product of isocyanatoethyl methacrylate and 3-[4-(dimethylamino)phenyl]-1-[4-(2-hydroxyethoxy)phenyl]-2-propene-1-one.

The amount of sensitizer moiety in the polymeric sensitizer and/or the amount of polymeric sensitizer present in the photopolymerizable composition is related to the optimum optical density desired, especially in relatively thick photopolymer layers. Optimum optical density is necessary for optimum absorption of radiation in the actinic region throughout the photopolymer layer. If the optical density of the radiation absorbing sensitized photopolymer element having either thick or thin layers is too low the photopolymer element will have reduced photospeed, and in the elements having thick layers the sidewalls of the developed image will generally slope outward at the bottom of the relief images due to radiation scattering off the surface of the support. On the other hand, if the optical density is too high, especially in elements having thick photopolymers layers, actinic radiation penetration is not adequate to reach the surface of the support and during liquid development solvent generally undercuts the polymerized images. For thick photoresists an optical density of 0.43 in the actinic region of the radiation absorbing photopolymer layer is preferred to yield substantially vertical image sidewalls.

Macromolecular organic polymeric binders (d) which may be present in the photopolymerizable compositions include: (1) copolyesters based on terephthalic, isophthalic, sebacic, adipic and hexahydroterephthalic acids; (2) nylons or polyamides; (3) vinylidene chloride copolymers; (4) ethylene/vinyl acetate copolymers; (5) cellulosic ethers; (6) polyethylene; (7) synthetic rubbers; (8) cellulose esters; (9) polyvinyl esters including polyvinyl acetate/acrylate and polyvinyl acetate/methacrylate copolymers; (10) polyacrylate and poly-α-alkylacrylate esters, e.g., polymethyl methacrylate and polyethyl methacrylate; (11) high molecular weight ethylene oxide polymers (polyethylene glycols) having weight average molecular weights from 4000 to 4,000,000; (12) polyvinyl chloride and copolymers; (13) polyvinyl acetal; (14) polyformaldehydes; (15) polyurethanes; (16) polycarbonates; and (17) polystyrenes.

A preferred group of binders includes polyacrylate esters and poly-α-alkyl-acrylate esters, particularly polymethyl methacrylate.

Optionally, leuco dyes can also be present in the photopolymerizable composition. By the term "leuco dye" is meant the colorless (i.e., the reduced) form of a dye compound which can be oxidized to its colored form by the triarylimidazolyl radical. Leuco dyes are disclosed in Baum & Henry U.S. Pat. No. 3,652,275, column 7, line 24 to column 11, line 32, the disclosure of which is incorporated herein by reference.

Accelerators or reducing agents such as oxygen scavengers and active hydrogen donors acting as chain transfer agents are useful additions to compositions to improve photospeed. Oxygen scavengers that have been found to be useful are phosphines, phosphonites, phosphites, stannous salts and other compounds that are easily oxidized by oxygen. Useful chain transfer agents are N-phenyl glycine, trimethylbarbituric acid, 2-mercaptobenzoxazole, 2-mercaptobenzothiazole, and other compounds that have hydrogens that are readily abstractable by radicals.

A wide range of nonpolymerizable plasticizers are effective in achieving improved exposure and development temperature latitude. Selection of a suitable plasticizer is determined by compatibility with other components of the photopolymerizable composition, particularly the binder and monomer. With acrylic binders, for example, dibutyl phthalate and other esters of aromatic acids; esters of aliphatic polyacids such as diisooctyl adipate, etc.; aromatic or aliphatic acid esters of glycols, polyoxyalkylene glycols, aliphatic polyols, etc.; alkyl and aryl phosphates; low molecular weight polyester of poly-α-methylstyrenes; chlorinated paraffins; and sulfonamide types may be used. In general, water insoluble plasticizers are preferred for greater high humidity storage stability, but are not necessary to get improved latitude. Other inert additives such as dyes, pigments and fillers are known to those skilled in the art. These additives are generally present in minor amounts and should not interfere with the exposure of the photopolymerizable layer.

The photopolymerizable compositions described herein may be coated on a wide variety of substrates. By "substrate" is meant any natural or synthetic support, preferably one which is capable of existing in a flexible or rigid film or sheet form. For example, the substrate could be a metal sheet or foil, a sheet or film of synthetic organic resin, cellulose paper, fiberboard, and the like, or a composite of two or more of these materials. Specific substrates include alumina-blasted aluminum, anodized aluminum, alumina-blasted polyethylene terephthalate film, polyethylene terephthalate film, e.g., resin-subbed polyethylene terephthalate film, flame or electrostatic discharge treated polyethylene terephthalate film, polyvinyl alcohol-coated paper, crosslinked polyester-coated paper, nylon, glass, cellulose acetate film, heavy paper such as lithographic paper, and the like. The particular substrate will generally be determined by the application involved. For example, when printed circuits are produced, the substrate may be a copper coating on fiberboard.

Preferably the layer of the photopolymerizable compositions have a thickness ranging from about 0.0001 inch (~0.003 cm) to about 0.01 inch (0.025 cm) and have low to moderate adherence to a thin, flexible, polymeric film support which may transmit radiation actinic to the photopolymerizable layer. The opposite side of the photopolymerizable layer may have adhered thereto a protective cover layer or cover sheet wherein the sheet has less adherence to the layer than the adherence between the film support and the layer. Preferred supports are a transparent polyethylene terephthalate film having a thickness of about 0.001 inch (~0.0025 cm) and a copper support. Polyethylene, 0.001 inch (~0.0025 cm) is a preferred cover sheet; polyvinyl alcohol coating is a preferred cover layer.

Any convenient source of actinic radiation providing wavelengths in the region of the spectrum that overlap the absorption bands of the ketone compounds can be used to activate the photopolymerizable compositions for radical formation, photopolymerization initiation and image formation. The light can be natural or artificial, monochromatic or polychromatic, incoherent or coherent, and for high efficiency should correspond closely in wavelengths to the sensitizer's principal absorption bands and should be sufficiently intense to activate a substantial proportion of the ketone compound.

Conventional light sources include fluorescent lamps, mercury, metal additive, pulsed xenon, and arc lamps providing narrow or broad light bands centered near 405, 436 and 546 nm (Hg) wavelengths. Coherent light sources are the pulsed xenon chloride, argon ion, and ionized neon-lasers. Visible emitting cathode ray tubes widely useful in printout systems for writing on photosensitive materials are also useful with the subject compositions. These in general involve an ultraviolet or visible-emitting phosphor internal coating as the means for converting electrical energy to light energy and a fiber optic face plate as the means for directing the radiation to the photosensitive target.

A preferred embodiment of the invention is illustrated in Example 1.

INDUSTRIAL APPLICABILITY

The photopolymerizable compositions of this invention are useful in photoresists in making printed circuits, in chemical milling, printing plates for offset and letterpress printing, toning films, etc. The nonmigratory polymeric sensitizers are particularly useful in multilayer elements. The concentration of the light absorbing species can be tailored for imaging performance. Thus by varying the concentration and spectral sensitivity of the particular polymeric sensitizer it is possible to control the extent of crosslinking throughout the depth of the layer during exposure of the photopolymerizable compositions.

EXAMPLES

This invention is illustrated but not limited by the following examples wherein the parts and percentages are by weight. The molecular weights of polymeric compounds are number average molecular weights ($\overline{M}_n$) or weight average molecular weight ($\overline{M}_w$). The $\overline{M}_n$ of the polymers can be determined by gel permeation chromatography employing a polybutadiene standard or other standard known to those skilled in the art. The $\overline{M}_w$ of the polymers can be determined by using a light scattering technique using known standard samples, e.g., polystyrene, polymethacrylic acid, poly(methyl methacrylate), etc., as known to those skilled in the art.

The polymeric sensitizers illustrative of the invention can be prepared as follows:

Polymeric Ultraviolet Sensitizer (A) Preparation of 1-[4-dimethylamino)phenyl]-1-(4-methoxyphenyl)-methanone In a 250 ml round bottom flask, 22.7 g of p-anisanilide, prepared from the reaction of p-anisoyl chloride and aniline in pyridine, 41.2 g N,N-dimethylaniline and 20.9 g phosphorus oxychloride were mixed and heated to 100° C. with an oil bath. An exothermic reaction ensued with the internal temperature reaching 160° C. Heating at 100° C. was continued for 3 hours. Dilute hydrochloric acid prepared by dilution of 13 ml concentrated hydrochloric acid to 100 ml with water was added to the cooled reaction mixture. After 35 minutes at room temperature, the resulting solution was filtered into 400 ml of water. A green solid was filtered, dried and recrystallized from 150 ml of ethanol to give 18.2 g of a light green solid, m.p. 130°–132° C., λmax (chloroform): 346 nm ($\epsilon$=25,000), 275 nm ($\delta$=11,600).

(B) Preparation of 1-[4-(dimethylamino)phenyl]-1-(4-hydroxyphenyl)-methanone

A solution of 10.0 g 1-[4-(dimethylamino)phenyl]-1-(4-methoxyphenyl)-methanone in 30 ml 48% hydrobromic acid was heated at reflux for 21 hours. The reaction mixture was poured into aqueous sodium bicarbonate and the precipitate filtered. Recrystallization from 150 ml of methanol gave 7.3 g of white solid, m.p. 199°–200° C.

(C) Preparation of 1-[4-(dimethylamino)phenyl]-1-[4-(2-hydroxyethoxy)-phenyl]-methanone A solution of 12.0 g of 1-[4-(dimethylamino)phenyl]-1-[4-hydroxyphenyl)-methanone and 2.2 g sodium hydroxide in 120 ml dimethylformamide was heated at 90° C. until all the sodium hydroxide had dissolved. 6.9 g 2-bromoethanol was added and the reaction heated at about 105° C. for 24 hours. The reaction mixture was poured into water and the product isolated by extraction with methylene chloride to yield 7.7 g, m.p. 142°–143° C., λmax (chloroform) 348 nm ($\epsilon$=26,400), 271 nm ($\epsilon$=12,500), 255 nm ($\epsilon$=11,900 nm).

Calc. for $C_{17}H_{19}NO_3$: C, 71.56; H, 6.71; N, 4.91. Found: C, 71.48; H, 6.83; N, 4.85.

(D) A Polymer of 95.1/4.9

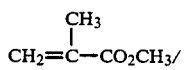

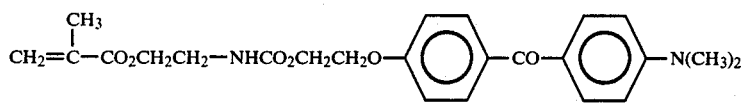

was prepared by refluxing under nitrogen a mixture of 150 g ethyl acetate and 50 g toluene, both previously dried with molecular sieves. A mixture of 196 g methyl methacrylate and 4 g isocyanatoethyl methacrylate was added over 2 hours. 3 g of α,α'-azodiisobutyronitrile in 35 ml of 3:2 ethyl acetate-toluene was added with a syringe pump over 2.5 hours. The reaction mixture was refluxed on additional 3.25 hrs and 6 g of 1-[4-(dimethylamino)phenyl]-1-[4-(2-hydroxyethoxy)phenyl]-methanone and 4 drops of 10% dibutyltin dilaurate in Cellosolve acetate were added. The reaction mixture was refluxed an additional 17 hours, a small amount of methanol added to destroy any unreacted isocyanate and the polymer precipitated with methanol in a Waring blending, λmax (chloroform): 348 nm (gram extinction coefficient K of 2.12).

Polymeric Visible Sensitizer 1

(A) Preparation of 4-(2-hydroxyethoxy)acetophenone

A mixture of 12.5 g 2-bromoethanol, 13.6 g p-hydroxyacetophenone and 4.4 g sodium hydroxide in 100 ml of dimethylformamide was heated at 150° C. for 15 hours. The mixture was poured into water and the product extracted with methylene chloride. Vacuum distillation gave 10 g of white solid.

(B). Preparation of 3-[4-(dimethylamino)phenyl]-1-[4-(2-hydroxyethoxy)-phenyl]-2-propene-1-one A mixture of 8.3 g of p-dimethylaminobenzaldehyde, 10.0 g 4-(2-hydroxyethoxy)acetophenone and 2.5 g sodium hydroxide in 100 ml of methanol was heated at reflux for 10 hours, cooled in an ice bath and the reaction mixture filtered and the solid washed with cold methanol. The dried product weighed 11.1 g, m.p. 127°–128.5° C., λmax (ethanol): 413 nm (ε=35,000), 303 nm (ε=13,400), 270 nm (ε=11,600), 234 nm (ε=11,500).

Calc. for $C_{19}H_{21}NO_3$ C, 73.29; H, 6.80; N, 4.50. Found: C, 73.56; H, 6.87; N, 4.69.

(C) A polymer of 82.9/11.4/5.7

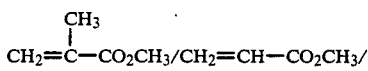

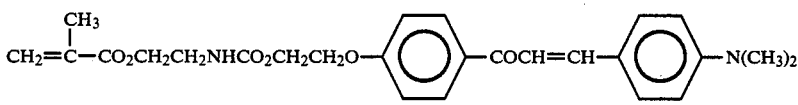

was prepared as follows:

In a dry 3 neck 1 liter flask under nitrogen a mixture of 150 g ethyl acetate, 50 g toluene and 2.6 g methyl acrylate which were pre-dried with molecular sieves was heated to reflux. A mixture of 140 g methyl methacrylate, 23 g methyl acrylate and 4.2 g isocyanatoethyl methacrylate was added over 2 hours followed by an additional 10 g of methyl methacrylate added over 30 minutes and 3 g of α,α'-azodiisobutyronitrile (AIBN) dissolved in 12 g ethyl acetate, 18 g toluene and 36 g methyl methacrylate was added over 2.5 hours. To this was added 8.6 g of 3-[4-(dimethylamino)phenyl]-1-[4-(2-hydroxyethoxy)phenyl]-2-propene-1-one and 4 drops of 10% dibutyltin dilaurate in Cellosolve acetate. The solution was heated to 50° C. for 17 hours. A small amount of methanol was added to destroy any unreacted isocyanate and the polymer was precipitated in methanol in a Waring blender. The polymer has a λmax=410 nm, a gram extinction coefficient K of 2.6, a Tg=61° C., and molecular weight analysis by GPC gave $\overline{M}_n$ 22,000; $\overline{M}_w$=181,000.

Polymeric Visible Sensitizer 2

A polymer of 94.2/5.8

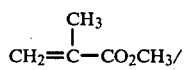

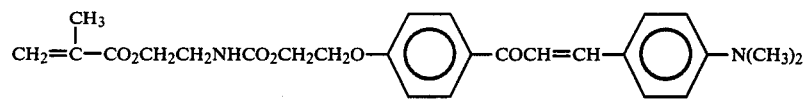

was prepared as polymeric visible sensitizer 1 using 196 g methyl methacrylate, 4 g isocyanatoethyl methacrylate and 8 g of 3-[4-(dimethylamino)phenyl]-1-[4-(2-hydroxyethoxy)phenyl]-2-propene-1-one. The monomers were added as a mixture over two hours and the reaction mixture heated at reflux overnight. The polymer was precipitated with methanol in a Waring blender. The product has a λmax of 412 nm with a gram extinction coefficient of 2.89. A molecular weight analysis by GPC using a poly(methyl methacrylate) standard gave $\overline{M}_n$=16,000; $\overline{M}_w$=34,000.

Polymeric Visible Sensitizer 3

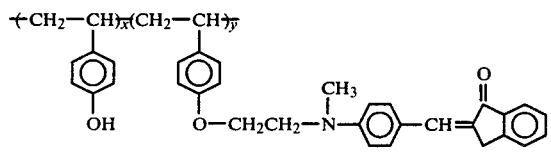

x is 1.0; y is 1.1

To a stirred solution of 25 ml dimethylformamide and 0.864 g sodium methoxide was added 1.93 g of poly p-hydroxystyrene (Aldrich Chemical Co., Milwaukee, Wis.) and 5 g of 2-(4'-N-ethyl, N-$\beta$-chloroethylaminobenzylidene)-1-indanone. The mixture was heated to 110° C. for 18 hours. After 2 hours all the components were in solution. The solution was cooled to room temperature and poured into 400 ml of water to precipitate an orange solid. The solid was washed 3 times with 100 ml water and stirred in a dilute hydrochloric acid solution, filtered, and again washed 2 times with 100 ml water. The solid was dissolved in 200 ml acetone and precipitated in 500 ml water. The supernatent was poured off the oily product which was dissolved in 100 ml of dimethylformamide. This was poured into 400 ml water, the solid washed 3 times with 100 ml water and vacuum oven dried at 50° C. The solid was stirred in 200 ml methylene chloride overnight and filtered to remove traces of starting material. The product has a $\lambda$max in dimethylformamide of 424 nm, $\epsilon = 11,000$. Nitrogen analysis suggests 52.5% incorporation which is consistent with the extinction coefficient of the absorption spectrum. The precursor 2-(4'-N-ethyl, N-$\beta$-chloroethylaminobenzylidene)-1-indanone was prepared as compounds described in Dueber U.S. Pat. No. 4,162,162; which is incorporated by reference.

EXAMPLE 1

Figure 1B:
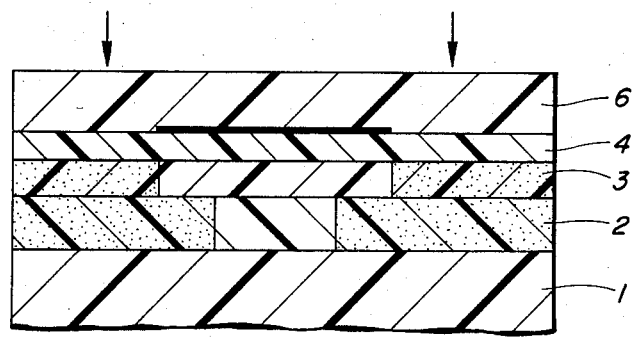
Figure 1C:
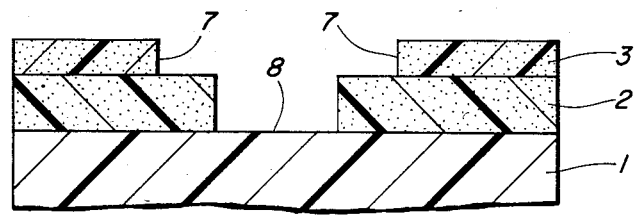

Two resists were prepared. A visible light sensitive resist 2 was laminated to a copper clad glass epoxy board 1 and an ultraviolet sensitive resist 3 having cover sheet 4 was laminated on top after removal of the cover sheet of resist element 2. Cover sheet 4 was retained. Since the visible sensitizer is polymeric, migration into the top layer does not occur. This restricted migration was demonstrated by using a visible light exposure through a photomask 5 as illustrated in FIG. 1A, replacing the first photomask with a second photomask 6, giving an ultraviolet exposure as shown in FIG. 1B and developing the unexposed image areas 7 and 8 as illustrated in FIG. 1C. A sidewall profile as shown in FIG. 1C is obtained. With this imaging capability two level image features are possible.

Preparation of Visible Sensitive Resist

A solution of the following ingredients was prepared:

| Ingredient | Amount (g) |
| --- | --- |
| 1 Bis(2-o-chlorophenyl-4,5-diphenylimidazole) | 1.25 |
| 2 Poly(methyl methacrylate), $\overline{M}_w$ = 200,000; Tg = 105° C. | 3.68 |
| 3 Poly(methyl methacrylate) (Lucite ® 147 KNL) | 17.01 |
| 4 Triethyleneglycol diacrylate stabilized with 200 ppm p-methoxyphenol | 7.50 |

| Ingredient | Amount (g) |
| --- | --- |
| 5 Trimethylolpropanetriacrylate | 7.50 |
| 6 Benzophenone | 2.00 |
| 7 Tri(2-methyl-4-N,N—diethylaminophenyl)methane | 0.08 |
| 8 Tri(p-N,N—dimethylaminophenyl)methane | 0.05 |
| 9 Green pigment[1] | 0.06 |
| 10 Mixture of p- and o-toluenesulfonamide (Sanitizer 9) | 3.00 |
| 11 Benzotriazole | 0.10 |
| 12 p-toluene sulfonic acid | 0.02 |
| 13 Methylene chloride | 107.50 |
| 14 Methanol | 9.00 |

[1] roll milled blend of 30% Pigment Green 18 and 70% copolymer of methyl methacrylate(34)/-styrene (42)/acrylonitrile(8)/butadiene(16)

After these components were in solution, 0.25 g of N-phenyl glycine was added. To 79.5 g of this solution was added 3.75 g of polymeric visible sensitizer 1 prepared as described above. The solution was coated to a thickness of 0.003 inch (0.0076 cm) on a 0.001 inch (0.0025 cm) thick polyethylene terephthalate film with a 0.020 inch (0.0508 cm) doctor knife on a Talboy's coater with film base traveling at 6 ft/min (183 cm/min) and the film traveling through a 12 ft (366 cm) dryer at 140° F. (60° C.). A 0.001 inch (0.0025 cm) thick polyethylene cover sheet was laminated to the resist film at 180° F. (82° C.), 40 psi (2.81 kg/sq cm).

Preparation of Ultraviolet Sensitive Resist

A stock solution of the following ingredients was prepared:

| Ingredient | Amount (g) |
| --- | --- |
| 1 Poly(methyl methacrylate); $\overline{M}_w$ = 200,000; Tg = 105° C. | 10.00 |
| 2 Poly(methyl methacrylate) Lucite ® 147 KNL | 46.72 |
| 3 Triethylene glycol diacrylate | 15.0 |
| 4 Trimethylolpropanetriacrylate | 15.0 |
| 5 Benzophenone | 4.00 |
| 6 Tri(2-methyl-4-N,N—diethylaminophenyl)methane | 0.15 |
| 7 Tri(p-N,N—dimethylaminophenyl)methane | 0.15 |
| 8 Green pigment described in visible sensitive resist | 0.12 |
| 9 Victoria green dye | 0.04 |
| 10 Mixture of p- and o-toluenesulfonamide | 6.00 |
| 11 Benzotriazole | 0.20 |
| 12 p-toluene sulfonic acid | 0.05 |
| 13 Methylene chloride | 215.0 |
| 14 Methanol | 18.0 |

After all the components were in solution 0.50 g N-phenyl glycine was added. To 50.0 g of this solution was added 0.074 g of 4-morpholinobenzophenone.

This solution was coated as the visible sensitive resist described above but with a 0.004 inch (0.0102 cm) doctor knife to give a 0.0005 inch (0.0013 cm) thick resist. The dryer temperature was 130° F. (54.4° C.).

Evaluation of UV Sensitive Resist/Visible Sensitive Resist

To a freshly pumice scrubbed glass epoxy copper clad board was laminated first the visible sensitive resist at 210° F. (99° C.), 40 psi (2.81 kg/sq cm), and 2 ft/min (61 cm/min). The cover sheet was removed from the laminated layer and the UV sensitive resist laminated on top at room temperature. Before each lamination the polyethylene cover sheets were removed. The two layer laminate was exposed through a line-pattern photomask for 50 units with a 2 KW Hg photopolymer Berkey Ascor ®1601-40 light source at a distance of 38 inches (96.5 cm) from the film with a UV filter prepared as described below. The photomask was replaced over the visible light exposed laminate 90° to the orientation for the visible exposure. This was exposed 25 units using the full spectrum of the source. The cover sheet was removed and unexposed resist developed away with 1,1,1-trichloroethane in a Riston ®A processor manufactured by E. I. du Pont de Nemours and Company, Wilmington, DE for 90 seconds which is 3 times the time necessary to totally develop away a nonexposed laminate. Reorientating the line pattern photomask demonstrated the two layer imaging capability. The image has a network of overlapping lines that form wells to the copper surface that have sidewalls to the top surface on two sides and sidewalls as high as the visible resist thickness of 0.003 inch (0.0076 cm) on the other two sides as shown in FIG. 1C. This imaging test demonstrated that the polymeric visible sensitizer did not migrate into the top layer since migration would have resulted in polymerization at the top surface during the visible exposure which would not yield a bi-layer image. Samples of the two layer laminate which were exposed as described above through $\sqrt[3]{2}$ step wedges and developed as described above gave $12\sqrt[3]{2}$ steps of polymer with visible exposure of 50 units and $14\sqrt[3]{2}$ steps of polymer with UV exposure of 25 units.

Composition of UV Filter

A solution of 720 g of cellulose acetate butyrate, 320 g ethyl Cellosolve, and 80 g of a UV absorber, 2,2'-dihydroxy-4-methoxybenzophenone, which was extrusion die coated on a Talboy's coater on 0.004 inch (0.0102 cm) thick resin-subbed polyethylene terephthalate film to a thickness of 0.00095 inch (0.024 mm), at 5 ft/min (152 cm/min) with a dryer temperature of 150° F. (65.6° C.).

EXAMPLE 2

A visible sensitive resist of the same composition as the visible resist of Example 1 was prepared except polymeric visible sensitizer 2 was used and the resist coating thickness was 0.0009 inch (0.0023 cm) since a 0.010 inch (0.0254 cm) doctor knife was used. Evaluation of the UV sensitive resist of this example was done by laminating the resists as described in Example 1. The same exposure source was used as for Example 1, but the laminate was exposed to a $\sqrt[3]{2}$ stepwedge pattern for 50 units through the UV filter of Example 1 followed by a 63 seconds development with the same developer as Example 1 to yield $6\sqrt[3]{2}$ steps of visible resist polymeric image. Another laminate prepared the same way was exposed 25 units without a filter and developed 63 seconds to give $6\sqrt[3]{2}$ steps of ultraviolet plus visible resist polymeric image.

EXAMPLE 3

A UV sensitive resist containing the polymeric UV sensitizer 1 was prepared from the following ingredients:

| Ingredient | Amount (g) |
|---|---|
| Polymeric UV sensitizer 1 | 6.22 |
| Bis(2-o-chlorophenyl-4,5-diphenyl-imidazole) | 2.86 |
| Benzophenone | 5.71 |
| Trimethylolpropanetriacrylate | 51.40 |
| Triethyleneglycol diacetate | 1.43 |
| Tri-o-tolyl phosphate | 2.86 |
| Copolymer of methyl methacrylate and and methacrylic acid (92/8); $M_w$ = 50,000, acid No. is 60 | 71.06 |
| Red Dye C.I. 109 | 0.43 |
| Benzotriazole | 0.29 |
| Methanol | 12.30 |
| Methylene chloride | 409.00 |

The solution was coated with a 0.020 inch (0.0508 cm) doctor knife on a Talboy's coater on 0.001 inch (0.0025 cm) polyethylene terephthalate film, with a web speed of 5 feet/minute (152.4 cm/min) and a dryer temperature of 150° F. (65.6° C.). A 0.001 inch (0.0025 cm) polyethylene cover sheet was laminated on the resist film at room temperature at 80 psi (5.62 kg/sq cm). The film was evaluated by lamination to freshly scrubbed glass epoxy copper boards after removal of the cover sheet at 220° F. (104.4° C.), 2 feet/minute (60.96 cm/min), 40 psi (2.81 kg/sq cm). The cover sheet was removed and a second layer was applied as the first layer to achieve a resist laminate thickness of 0.004 inch (0.0102 cm). The laminate was exposed with the exposure source described in Example 1 for 160 units with a resolution test photomask of varying line widths and spaces. The exposed laminate was developed for 3 minutes and 12 seconds which is 2 times the time to develop away unexposed resist. The developer was 3.47 liter of butyl Cellosolve, 324 g sodium borate and 32.5 liter water in a Riston ®A processor described in Example 1. The developed image resolved 0.005 inch (0.0127 cm) lines with 0.006 inch (0.0152 cm) spaces between. The $\sqrt{2}$ stepwedge response for the exposure source processed sample was 16 Riston ® steps ($26\sqrt{2}$ steps).

EXAMPLE 4

A film composition was prepared from the following ingredients:

| Ingredient | Amount (g) |
|---|---|
| Polymeric visible sensitizer 3 | 0.015 |
| Bis(2-o-chlorophenyl-4,5-diphenyl-imidazole) | 0.130 |
| Tetraethyleneglycol dimethacrylate | 0.230 |
| Copolymer of styrene/maleic anhydride (1.4/1) partially esterified with isobutanol mixture, acid no. 190, $M_w$ = 100,000 | 0.554 |
| Terpolymer of ethyl acrylate (56.6), methyl methacrylate (37.6), acrylic acid (7.0), acid no. 76–85; $M_w$ = 100,000 | 0.553 |
| Methylene chloride | 7.95 |
| Methanol | 1.40 |

The solution was coated with a 0.002 inch (0.0051 cm) doctor knife on the resin side of 0.004 inch (0.0102 cm) thick resin subbed polyethylene terephthalate film, air dried and a 0.001 inch (0.0025 cm) polyethylene terephthalate cover sheet laminated at 180° F. (82.2° C.) at 4 ft/min (121.9 cm/min), 40 psi (2.81 kg/sq cm). The film was exposed with the exposure source of Example 1 through a $\sqrt[3]{2}$ stepwedge for 30 units for one sample and 300 units for another. Both were developed for 7 seconds in a 22° C. solution of 84 g potassium carbonate 1.5 hydrate, 5 g potassium hydrogen carbonate and 1536 g distilled water. Immediately after development the films were spray rinsed with water at 32° C. at a pressure of 40 psi (2.81 kg/sq cm). The number of $\sqrt[3]{2}$ steps of polymer image was 13 for the 30 unit exposed sample and 24 for the 300 unit exposed sample.

EXAMPLE 5

This example demonstrates that a nonpolymeric visible sensitizer migrates into the top UV sensitive layer causing polymerization to occur at the top surface which destroys the desired two layer image. The top UV sensitive layer was the same as described in Example 1. The bottom visible sensitive resist composition was prepared from 50 g of the stock solution described for the ultraviolet sensitive resist of Example 1, 0.381 g bis(2-o-chlorophenyl-4,5-diphenylimidazole), and 0.076 g of:

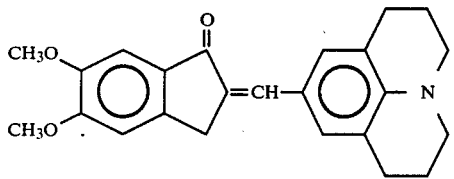

2-[9′(2′,3′,6′,7′-tetrahydro-1H,5H-benzo[ij]-quinolylidene)]-5,6-dimethoxy-1-indanone. The visible sensitive coating solution was coated in the same manner as the top layer UV sensitive coating solution except that a 0.010 inch (0.0254 cm) doctor knife was used to yield a coating thickness of 0.0022 inch (0.0056 cm). As described in Example 1 the visible sensitive film was laminated first to the copper clad board, however, after removal of the cover sheet the top layer was laminated at room temperature at 40 psi (2.81 kg/sq cm) and 2 feet/minute (0.61 m/minute). The top layer was laminated without heat to minimize migration of the visible sensitizer into the top layer. Immediately after lamination the two layer laminate was exposed for 25 units through the UV filter and phototool used in Example 1 with the same radiation source as described in Example 1. This was followed by a 15 unit exposure with the full spectrum of the exposure source with the phototool turned 90° to the orientation of the first exposure. Development of 90 seconds, which was three times the time required to develop away a nonimaged sample, with the same developer as used in Example 1 gave no bi-layer image. The two layer laminate polymerized at the top with the visible exposure, indicating that the visible sensitizer had migrated into the top layer. Samples of a two layer laminate prepared as described in Example 1 which were exposed as described above in this example through $\sqrt[3]{2}$ stepwedges and also developed as described above in this example gave 11$\sqrt[3]{2}$ steps of polymer with the visible exposure of 25 units and 10$\sqrt[3]{2}$ steps of polymer with the UV exposure of 15 units.

We claim:

1. A photopolymerizable composition consisting essentially of (A) at least one nongaseous ethylenically unsaturated compound having at least one terminal ethylenically unsaturated group, a boiling point above 100° C. at normal atmospheric pressure and being capable of addition polymerization;

(B) at least one 2,4,5-triarylimidazolyl dimer consisting of two lophine radicals bound together by a single covalent bond;

(C) at least one polymeric sensitizer sensitive to ultraviolet or visible radiation and having a weight average molecular weight in the range of 10,000 to 300,000, the polymeric sensitizer being the reaction product of (1) a reactive sensitizer moiety of the formula:

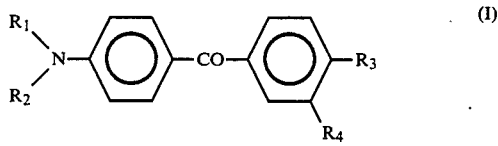

wherein $R_1$ is alkyl of 1 to 12 carbon atoms:

$R_2$ is alkyl of 1 to 12 carbon atoms, $-CH_2CH_2Cl$;

$R_3$ is H, and with the proviso that when $R_2$ is not $-CH_2CH_2Cl$, $R_3$ can be one of $-O(CH_2CH_2O)_n-CH_2CH_2OH$, $-O(CH_2CH_2CH_2O)_n-CH_2CH_2CH_2OH$ wherein n is 0 to 10, $-OCH_2CH_2NH_2$, $-(CH_2)_nOH$, $-(CH_2)_nNH_2$ wherein n is 1 to 12; and $R_4$ is H, and with the proviso that when $R_2$ is not $-CH_2CH_2Cl$ and $R_3$ is H, $R_4$ is one of $-O(CH_2CH_2O)_n-CH_2CH_2OH$, $-O(CH_2CH_2CH_2O)_n-CH_2CH_2CH_2OH$ wherein n is 0 to 10, $-OCH_2CH_2NH_2$, $-(CH_2)_nOH$, $-(CH_2)_nNH_2$ wherein n is 1 to 12;

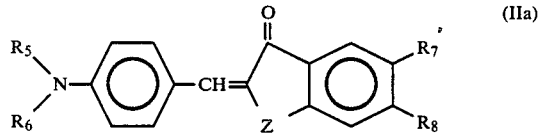

wherein Z is $-CH_2-$; $-CH_2CH_2-$; $-CH_2O-$ with oxygen bonded to the aromatic ring;

$R_5$ is alkyl of 1 to 12 carbon atoms;

$R_6$ is alkyl of 1 to 12 carbon atoms, $-CH_2CH_2Cl$;

$R_7$ is H, $-OCH_3$, and with the proviso that when $R_6$ is not $-CH_2CH_2Cl$, $R_7$ can be one of $-O(CH_2CH_2O)_n-CH_2CH_2OH$, $-O(CH_2CH_2CH_2O)_n-CH_2CH_2CH_2OH$ wherein n is 0 to 10, $-OCH_2CH_2NH_2$, $-(CH_2)_nOH$, $-(CH_2)_nNH_2$ wherein n is 1 to 12; and $R_8$ is H, $-OCH_3$, and with the proviso that when $R_6$ is not $-CH_2CH_2Cl$ and $R_7$ is H or $-OCH_3$, $R_8$ is one of $-O(CH_2CH_2O)_n-CH_2CH_2OH$, $-O(CH_2CH_2CH_2O)_n-CH_2CH_2CH_2OH$ wherein n is 0 to 10, $-OCH_2CH_2NH_2$, $-(CH_2)_nOH$, $-(CH_2)_nNH_2$ wherein n is 1 to 12;

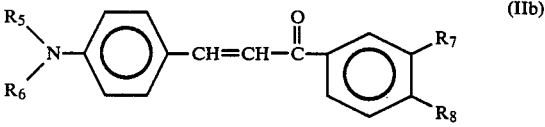

wherein $R_5$ is alkyl of 1 to 12 carbon atoms;

$R_6$ is alkyl of 1 to 12 carbon atoms, $-CH_2CH_2Cl$;

$R_7$ is H, $-OCH_3$, and with the proviso that when $R_6$ is not $-CH_2CH_2Cl$, $R_7$ can be one of $-O(CH_2C-$ $H_2O)_n$—$CH_2CH_2OH$, —$O(CH_2CH_2CH_2O)_n$—$CH_2CH_2CH_2OH$ wherein n is 0 to 10, —$OCH_2CH_2NH_2$, —$(CH_2)_nOH$, —$(CH_2)_nNH_2$ wherein n is 1 to 12; and $R_8$ is H, —$OCH_3$, and with the proviso that when $R_6$ is not —$CH_2CH_2Cl$ and $R_7$ is H or —$OCH_3$, $R_8$ is one of —$O(CH_2CH_2O)_n$—$CH_2CH_2OH$, —$O(CH_2CH_2CH_2O)_n$—$CH_2CH_2CH_2OH$ wherein n is 0 to 10, —$OCH_2CH_2NH_2$, —$(CH_2)_nOH$, —$(CH_2)_nNH_2$ wherein n is 1 to 12; and (2) a reactive polymer taken from the group consisting of methyl methacrylate, methyl acrylate, isocyanatoethyl methacrylate, maleic anhydride, chloromethyl styrene, p-hydroxystyrene, acrylic acid, methacrylic acid, phenolformaldehyde resins, epoxy polymers, and mixtures of said polymers, the polymeric sensitizer having 0.1 to 70% by weight of the sensitizer moiety; and (D) 0 to 97 parts by weight of at least one organic polymeric binder relative to 3 to 100 parts by weight of ethylenically unsaturated compound (A); component (B) being present in an amount of 0.001 to 20 parts by weight per 100 parts by weight of the combined weight of components (A) and (D); and component (C) being present in an amount of 0.1 to 80% by weight based on the total dry weight of the composition.

2. A photopolymerizable composition according to claim 1 wherein the polymeric sensitizer (C) is active in the ultraviolet region of the spectrum and is a copolymer of methyl methacrylate and the reaction product of isocyanatoethyl methacrylate and 1-[4-(dimethylamino)phenyl]-1-[4-(2-hydroxyethoxy)phenyl]-methanone.

3. A photopolymerizable composition according to claim 1 wherein the polymeric sensitizer (C) is active in the visible region of the spectrum and is a copolymer of methyl methacrylate, methyl acrylate and the reaction product of isocyanatoethyl methacrylate and 3-[4-(dimethylamino)phenyl]-1-[4-(2-hydroxyethoxy)-phenyl]-2-propene-1-one.

4. A photopolymerizable composition according to claim 1 wherein the polymeric sensitizer (C) is active in the visible region of the spectrum and is a copolymer of methyl methacrylate and the reaction product of isocyanatoethyl methacrylate and 3-[4-(dimethylamino)-phenyl]-1-[4-(2-hydroxyethoxy)phenyl]-2-propene-1-one.

5. A photopolymerizable composition according to claim 1 wherein the polymeric sensitizer (C) is active in the visible region of the spectrum and is the reaction product of poly(p-hydroxystyrene) and 2-(4'-N-ethyl-N-$\beta$-chloroethylaminobenzylidene)-1-indanone.

6. A photopolymerizable composition according to claim 1 wherein there is present a poly(methyl methacrylate)organic polymeric binder.

7. A photopolymerizable composition according to claim 1 wherein the ethylenically unsaturated compound is trimethylolpropane triacrylate.

8. A photopolymerizable element comprising a support bearing a layer of a composition according to claim 1.

9. A photopolymerizable element according to claim 8 wherein the support is a metallic surface.

10. A photopolymerizable element according to claim 9 wherein the support is copper.

11. A photopolymerizable element according to claim 8 wherein the support is polyethylene terephthalate.

* * * * *